United States Patent
Morita et al.

(10) Patent No.: US 11,617,267 B2
(45) Date of Patent: Mar. 28, 2023

(54) ELECTRONIC ELEMENT MOUNTING SUBSTRATE AND ELECTRONIC DEVICE

(71) Applicant: KYOCERA Corporation, Kyoto (JP)

(72) Inventors: Yukio Morita, Kyoto (JP); Noboru Kitazumi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/833,157

(22) Filed: Jun. 6, 2022

(65) Prior Publication Data
US 2022/0304159 A1    Sep. 22, 2022

Related U.S. Application Data

(63) Continuation of application No. 16/650,425, filed as application No. PCT/JP2018/035663 on Sep. 26, 2018, now Pat. No. 11,382,215.

(30) Foreign Application Priority Data

Sep. 28, 2017  (JP) .............................. JP2017-188493

(51) Int. Cl.
H05K 1/00      (2006.01)
H05K 1/18      (2006.01)
H05K 1/02      (2006.01)

(52) U.S. Cl.
CPC ............ *H05K 1/183* (2013.01); *H05K 1/021* (2013.01); *H05K 1/184* (2013.01); *H05K 1/188* (2013.01); *H05K 2201/09036* (2013.01); *H05K 2201/09072* (2013.01)

(58) Field of Classification Search
CPC ........ H05K 1/183; H05K 1/021; H05K 1/184; H05K 1/188; H05K 2201/09036; H05K 2201/09072
See application file for complete search history.

(56) References Cited

U.S. PATENT DOCUMENTS

| | | | |
|---|---|---|---|
| 6,340,796 B1 * | 1/2002 | Smith | .................... H05K 1/056 428/113 |
| 2006/0076570 A1 | 4/2006 | Chen et al. | |
| 2010/0007013 A1 | 1/2010 | Kuroda et al. | |
| 2010/0224354 A1 | 9/2010 | Dooley | |
| 2011/0303399 A1 | 12/2011 | Sakimichi et al. | |

(Continued)

FOREIGN PATENT DOCUMENTS

| | | |
|---|---|---|
| EP | 2226862 A | 9/2010 |
| JP | 2011-159662 A | 8/2011 |

(Continued)

*Primary Examiner* — Pete T Lee
(74) *Attorney, Agent, or Firm* — Volpe Koenig

(57) ABSTRACT

An electronic element mounting substrate includes a first substrate that has a first main surface, has a rectangular shape, and has a mounting portion for an electronic element on the first main surface, and a second substrate that is located on a second main surface opposite to the first main surface, is made of a carbon material, has a rectangular shape, has a third main surface facing the second main surface and a fourth main surface opposite to the third main surface, in which the third main surface or the fourth main surface has heat conduction in a longitudinal direction greater than heat conduction in a direction perpendicular to the longitudinal direction, and that has a recessed portion on the fourth main surface.

17 Claims, 10 Drawing Sheets

(56) References Cited

U.S. PATENT DOCUMENTS

| | | |
|---|---|---|
| 2011/0316035 A1* | 12/2011 | Shin .................. H01L 23/4006 |
| | | 257/E33.056 |
| 2012/0012995 A1 | 1/2012 | Kuroda et al. |
| 2013/0010481 A1* | 1/2013 | Qin ...................... F21V 29/89 |
| | | 362/382 |
| 2014/0225135 A1 | 8/2014 | Ahn et al. |
| 2015/0052742 A1 | 2/2015 | Lee et al. |
| 2015/0075186 A1 | 3/2015 | Prajapati |
| 2016/0249445 A1 | 8/2016 | Min et al. |
| 2017/0317250 A1 | 11/2017 | Konishi et al. |
| 2018/0063996 A1 | 3/2018 | Vitale |

FOREIGN PATENT DOCUMENTS

| | | |
|---|---|---|
| JP | 2014-075429 A | 4/2014 |
| JP | 2014-120502 A | 6/2014 |
| JP | 2015-103684 A | 6/2015 |
| WO | 2008/053586 A1 | 5/2008 |
| WO | 2016/067794 A1 | 5/2016 |
| WO | 2016/080393 A1 | 5/2016 |

\* cited by examiner

ELECTRONIC ELEMENT MOUNTING SUBSTRATE AND ELECTRONIC DEVICE

CROSS REFERENCE TO RELATED APPLICATION

This application is a continuation application of U.S. patent application Ser. No. 16/650,425 filed on Mar. 25, 2020, which is a National Phase entry based on PCT Application No. PCT/JP2018/035663, filed on Sep. 26, 2018, which claims the benefit of Japanese Patent Application No. 2017-188493, filed on Sep. 28, 2017. The contents of which are incorporated by reference herein in their entirety.

TECHNICAL FIELD

The present invention relates to an electronic element mounting substrate and an electronic device.

BACKGROUND ART

In the related art, an electronic element mounting substrate includes an insulating substrate having a first main surface, a second main surface, and side surfaces, and an electronic element mounting portion and a wiring layer on the first main surface of the insulating substrate. In the electronic element mounting substrate, an electronic element is mounted on the electronic element mounting portion, and then mounted on an electronic element mounting package to form an electronic device. For example, if an optical element such as a laser diode (LD) or a light emitting diode (LED) is mounted as an electronic element, since such an optical element has characteristics that the amount of emitted light decreases as the temperature rises, it is necessary to take measures to dissipate heat and suppress the temperature rise. On the other hand, a countermeasure is taken in which a substrate on which an LED element is mounted is fixed on a heat sink (also referred to as "heat radiating member"), and heat generated in the LED element is released to the heat sink (refer to Japanese Unexamined Patent Application Publication No. 2014-120502).

SUMMARY OF INVENTION

Solution to Problem

The present disclosure provides an electronic element mounting substrate including a first substrate that has a first main surface, has a rectangular shape, and has a mounting portion for an electronic element on the first main surface, and a second substrate that is located on a second main surface opposite to the first main surface, is made of a carbon material, has a rectangular shape, has a third main surface facing the second main surface and a fourth main surface opposite to the third main surface, in which the third main surface or the fourth main surface has heat conduction in a longitudinal direction greater than heat conduction in a direction perpendicular to the longitudinal direction, and that has a recessed portion on the fourth main surface.

The present disclosure provides an electronic device including the electronic element mounting substrate with the above configuration, an electronic element mounted on the mounting portion of the electronic element mounting substrate, and a heat transfer member in the recessed portion.

DESCRIPTION OF EMBODIMENTS

Figure 1A:
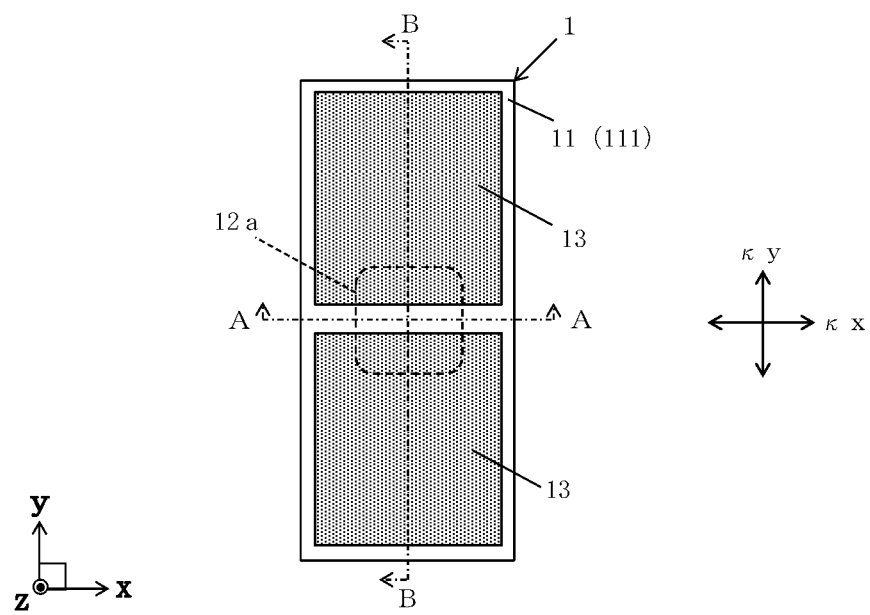
FIG. 1A is a top view illustrating an electronic element mounting substrate according to a first embodiment.
Figure 1B:
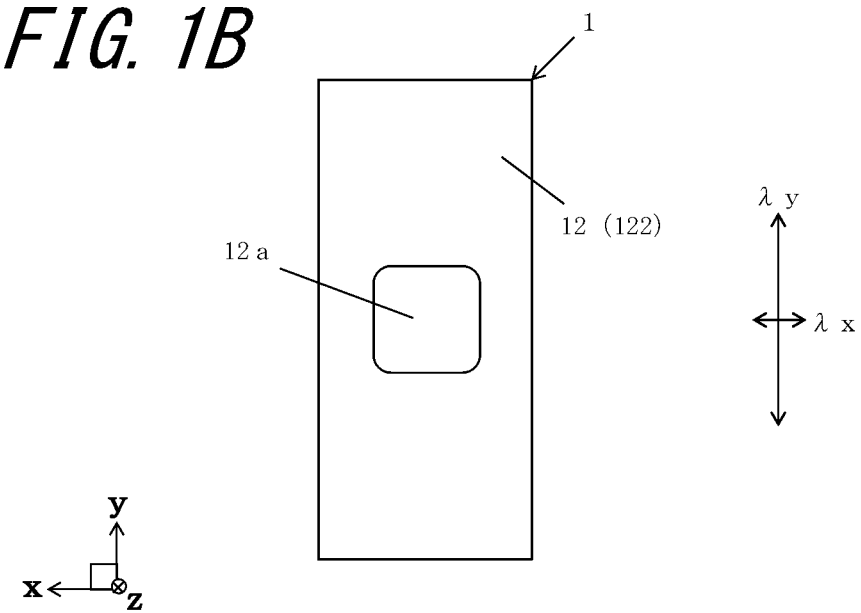
FIG. 1B is a bottom view of FIG. 1A.

Several exemplary embodiments of the present disclosure will be described with reference to the accompanying drawings.

(First embodiment) An electronic element mounting substrate 1 according to a first embodiment includes a first substrate 11 and a second substrate 12 including a recessed portion 12a, as in an example illustrated in FIGS. 1A to 4B. An electronic device includes the electronic element substrate 1 and an electronic element 2 mounted on a mounting portion 11a of the electronic element mounting substrate.

Figure 4A:
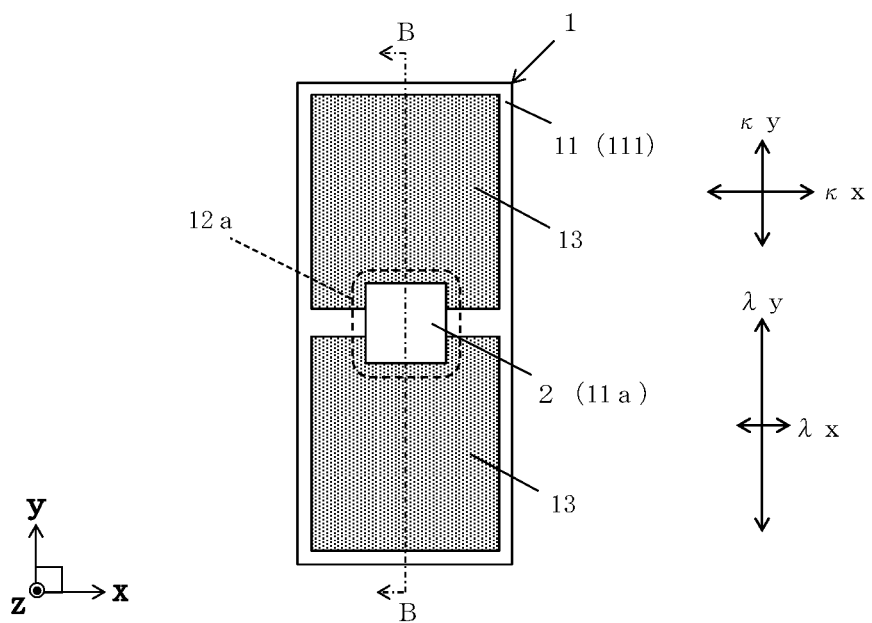
FIG. 4A is a top view illustrating an electronic device in which electronic elements are mounted on the electronic element mounting substrate illustrated in FIG. 1A and a heat sink is removed.
Figure 4B:
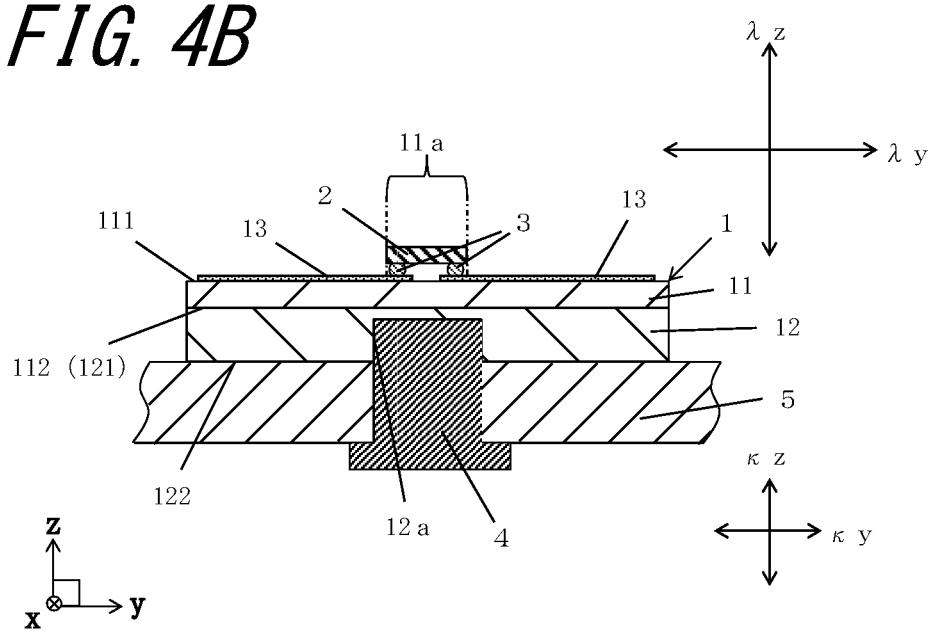
FIG. 4B is a longitudinal sectional view including the heat sink taken along the line B-B in FIG. 4A.
Figure 5A:
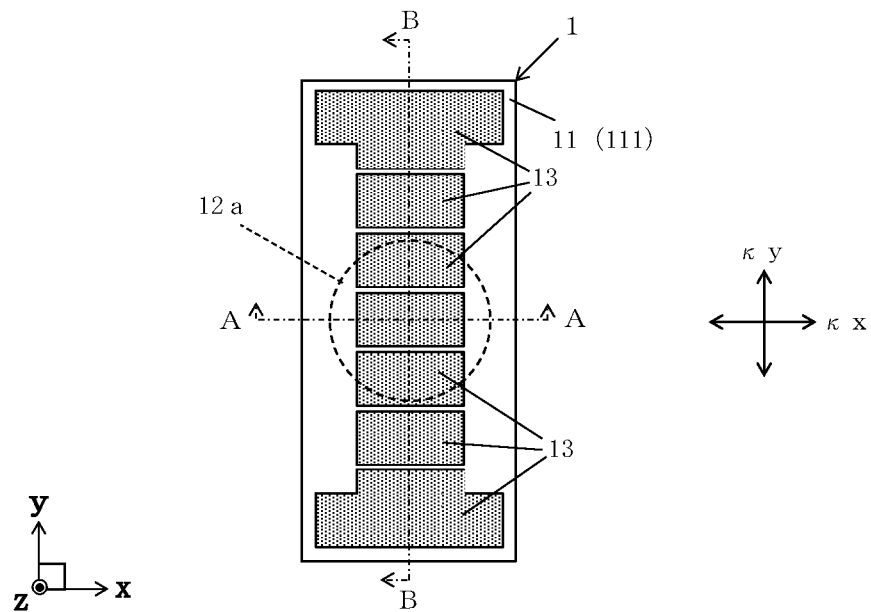
FIG. 5A is a top view illustrating an electronic element mounting substrate according to a second embodiment.
Figure 5B:
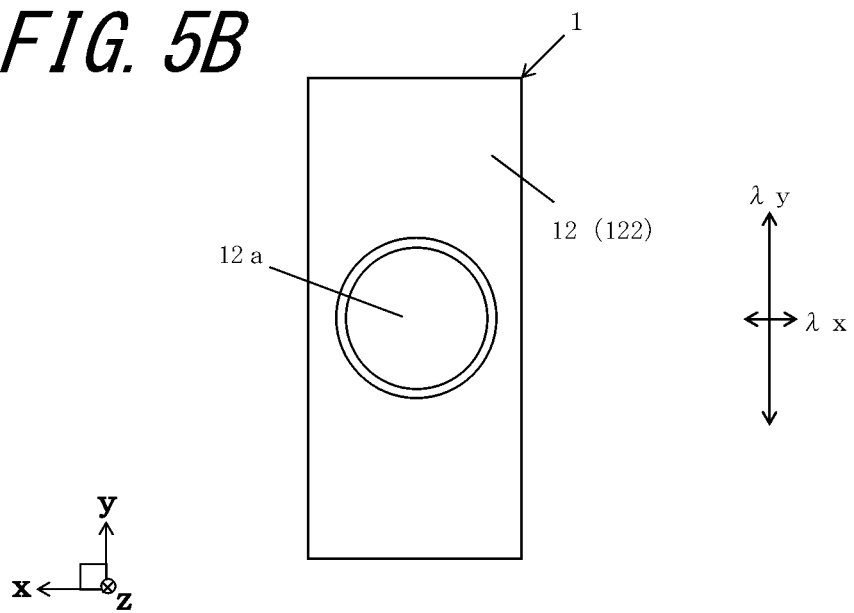
FIG. 5B is a bottom view of FIG. 5A.
Figure 6A:
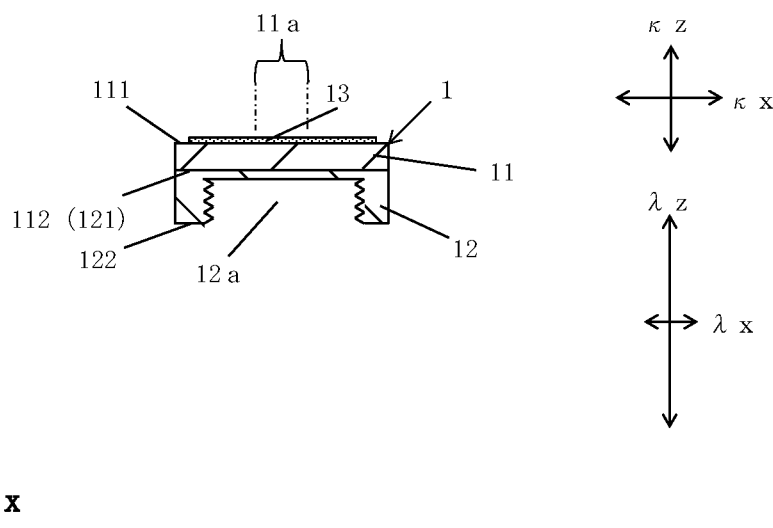
FIG. 6A is a longitudinal sectional view taken along the line A-A of the electronic element mounting substrate illustrated in FIG. 5A.
Figure 6B:
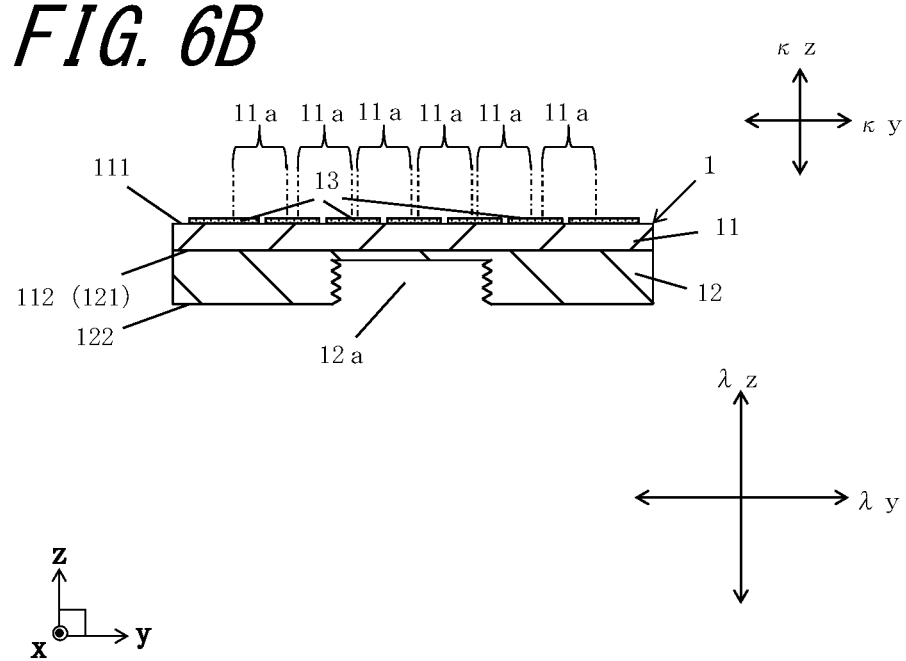
FIG. 6B is a longitudinal sectional view taken along the line B-B.
Figure 7A:
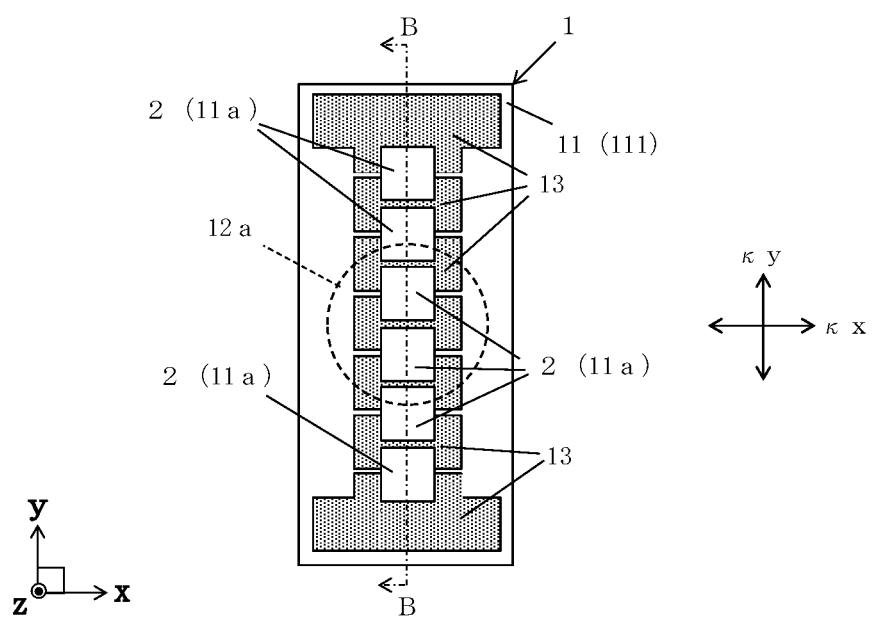
FIG. 7A is a top view illustrating another example of an electronic device excluding the electronic element mounting substrate and a heat sink according to the second embodiment.
Figure 7B:
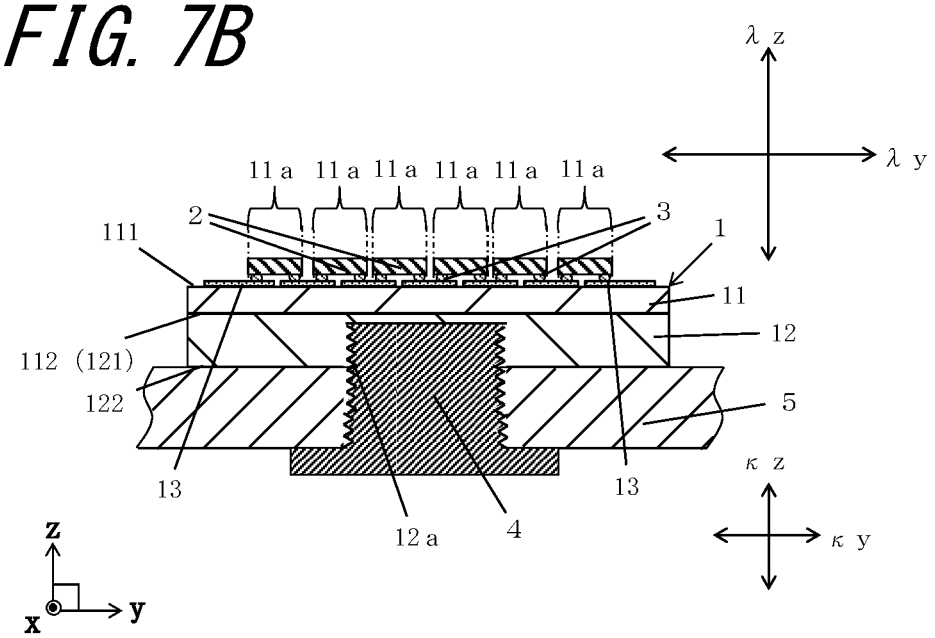
FIG. 7B is a longitudinal sectional view including the heat sink taken along the line B-B of FIG. 7A.
Figure 8A:
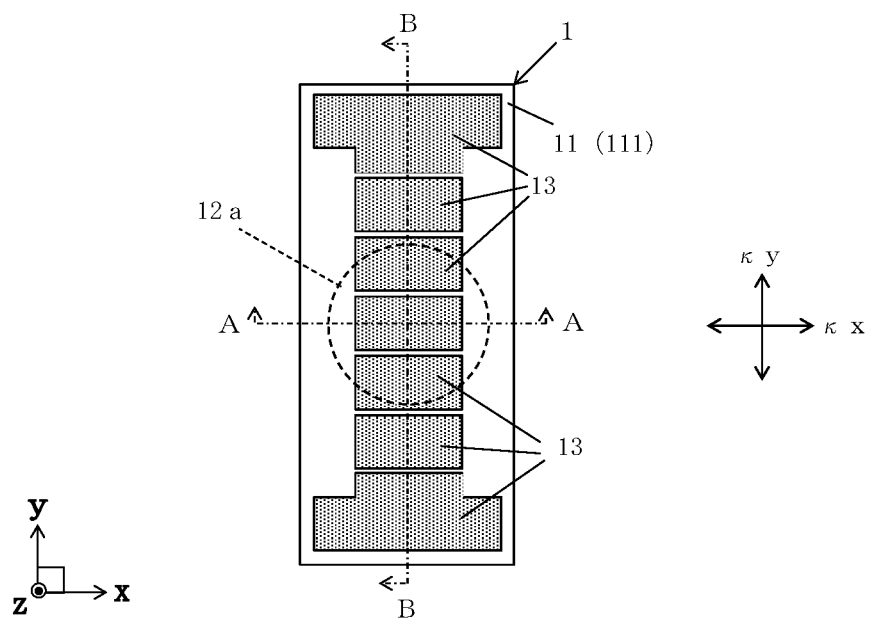
FIG. 8A is a top view illustrating an electronic element mounting substrate according to a third embodiment.
Figure 8B:
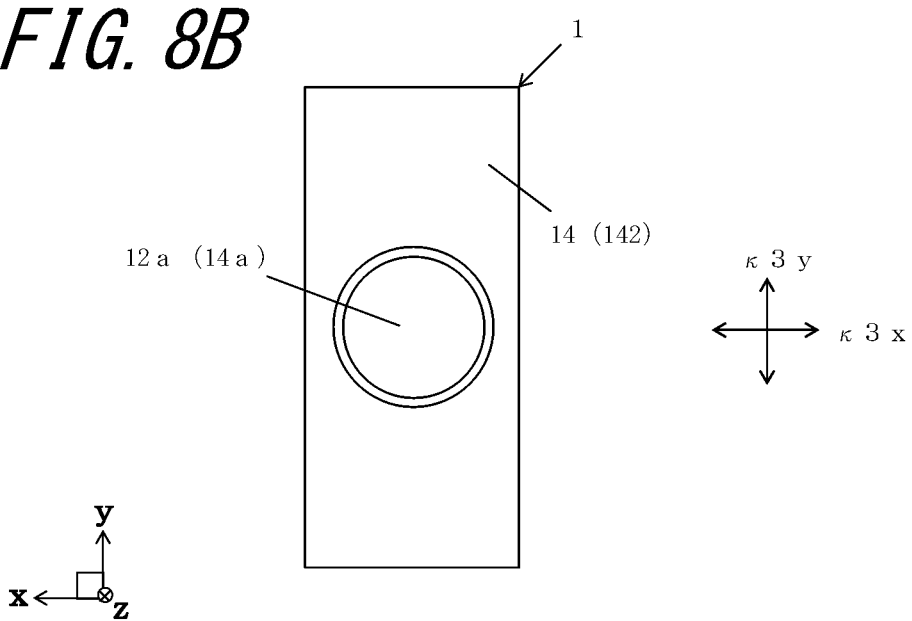
FIG. 8B is a bottom view of FIG. 8A.
Figure 9A:
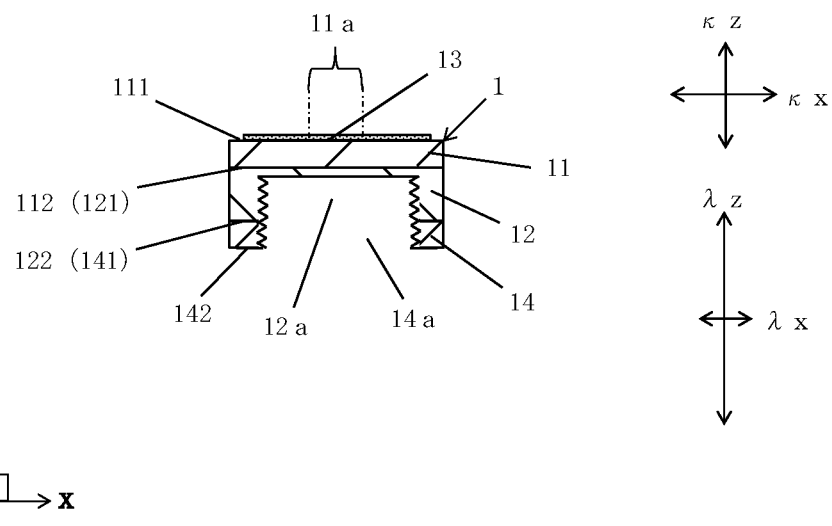
FIG. 9A is a longitudinal sectional view taken along the line A-A of the electronic element mounting substrate illustrated in FIG. 8A.
Figure 9B:
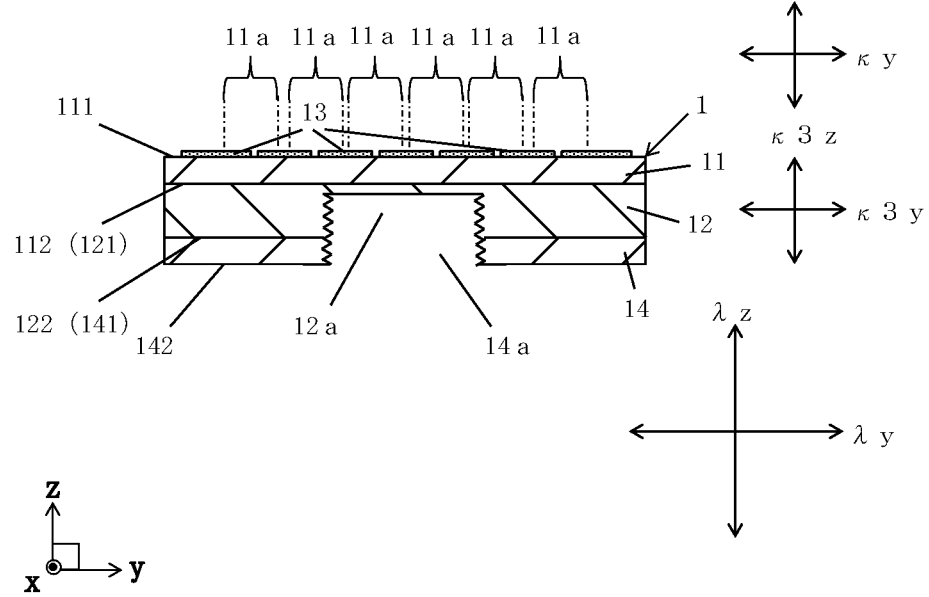
FIG. 9B is a longitudinal sectional view taken along the line B-B.
Figure 10A:
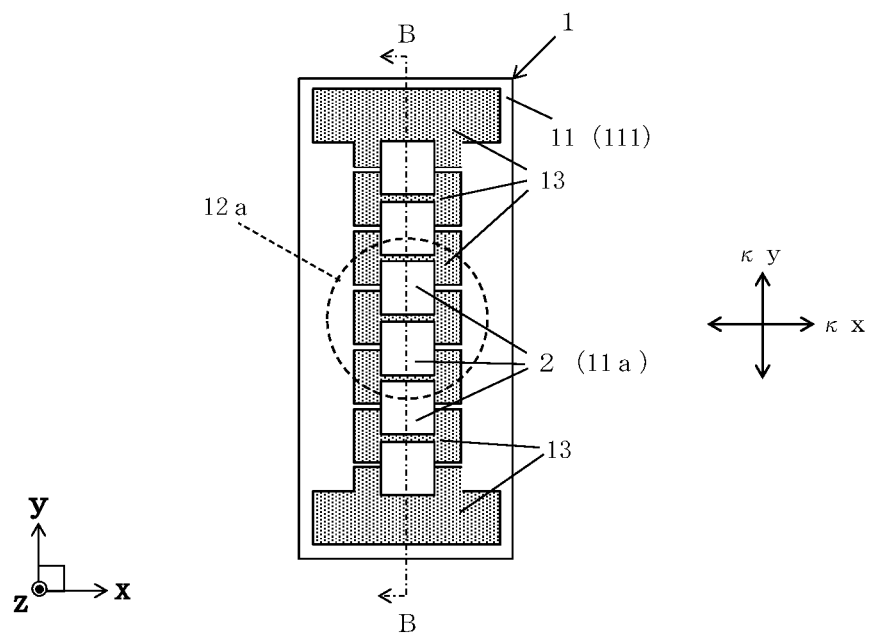
FIG. 10A is a top view illustrating an electronic device in which electronic elements are mounted on the electronic element mounting substrate illustrated in FIG. 8A and a heat sink is removed.
Figure 10B:
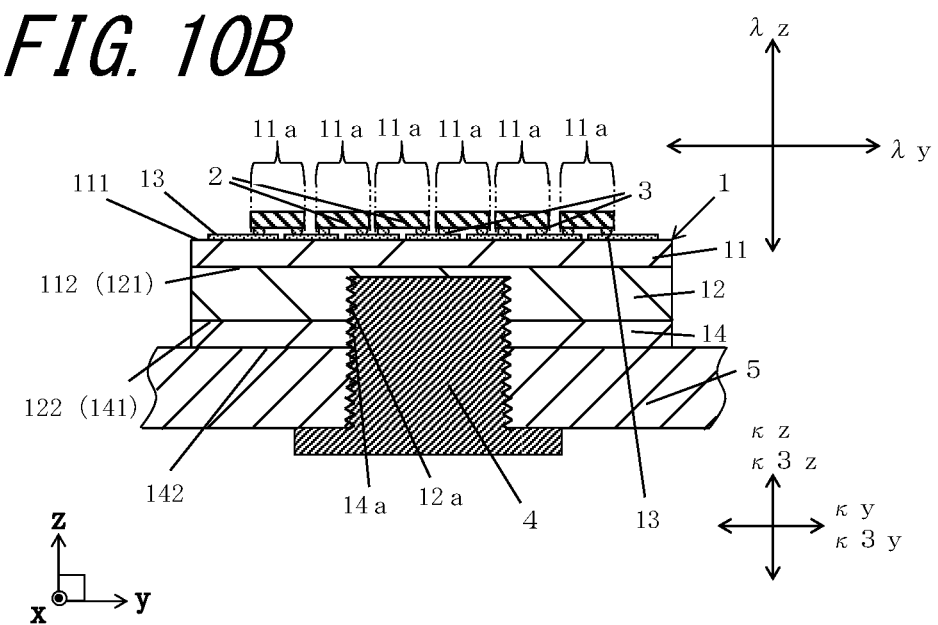
FIG. 10B is a longitudinal sectional view including the heat sink taken along the line B-B.

The electronic element mounting substrate 1 in the first embodiment includes a first substrate 11 and a second substrate 12. The first substrate 11 includes a first main surface 111, has a rectangular shape, and includes the mounting portion 11a for the electronic element 2 on the first main surface 11. The second substrate 12 is located on a second main surface 112 opposite to the first main surface 111, is made of a carbon material, has a rectangular shape, and includes a third main surface 121 facing the second main surface 112 and a fourth main surface 122 opposite to the third main surface 121. In the second substrate 12, the third main surface 121 or the fourth main surface 122 has heat conduction in a longitudinal direction greater than heat conduction in a direction perpendicular to the longitudinal direction in perspective plan view. The second substrate 12 includes a recessed portion 12a on the fourth main surface. The first substrate 11 includes a metal layer 13 on a surface. In FIGS. 4A and 4B, the electronic element 2 is mounted on an xy plane in a virtual xyz space. In FIGS. 1A to 4B, an upward direction means a positive direction of a virtual z axis. The distinction between the upper and lower sides in the following description is for convenience, and does not limit the upper and lower sides if the electronic element mounting substrate 1 or the like is actually used.

The metal layer 13 is illustrated by hatching in the examples illustrated in FIGS. 1A to 4B. In the first substrate 11, in the example illustrated in FIG. 2A, an outer surface of the first substrate 11 which is invisible in perspective is indicated by a broken line. In the second substrate 12, in the example illustrated in FIG. 2B, the outer surface of the first substrate 11 and an inner side surface of the recessed portion 12a which are invisible in perspective are indicated by broken lines.

The first substrate 11 is formed of a single insulating layer or a plurality of insulating layers, and includes the first main surface 111 (upper surface in FIGS. 1A to 4B) and the second main surface 112 (lower surface in FIGS. 1A to 4B). The substrate 11 includes the single insulating layer in the examples illustrated in FIGS. 1A to 4B. The first substrate 11 has a rectangular plate-like shape having two sets of opposite sides (four sides) with respect to each of the first main surface 111 and the second main surface 112 in plan view. The first substrate 11 includes the mounting portion 11a for mounting the electronic element 2 on the first main surface 111, and has a rectangular shape that is long in one direction in plan view in the examples illustrated in FIGS. 1A to 4B. The first substrate 11 functions as a supporter for supporting the electronic element 2, and the electronic elements 2 are bonded and fixed to the mounting portion 11a on the first main surface 111 of the first substrate 11 with bonding members.

For the first substrate 11, for example, ceramics such as an aluminum oxide sintered body (alumina ceramics), an aluminum nitride sintered body, a mullite sintered body, or a glass ceramic sintered body can be used. If the first substrate 11 is an aluminum nitride sintered body, for example, material powder composed of aluminum nitride (AlN), erbium oxide ($Er_2O_3$), yttrium oxide ($Y_2O_3$) or the like are added to and mixed with an appropriate organic binder, solvent, or the like to prepare a slurry. A ceramic green sheet is prepared by forming this slurry into a sheet by using a known method, such as a doctor blade method or a calender roller method. If necessary, a plurality of ceramic green sheets is laminated, and the ceramic green sheets are fired at a high temperature (approximately 1,800° C.) to prepare the first substrate 11 made of the single insulating layer or the plurality of insulating layers.

The second substrate 12 includes the third main surface 121 (upper surface in FIGS. 1A to 4B) and the fourth main surface 122 (lower surface in FIGS. 1A to 4B). The second substrate 12 has a rectangular plate-like shape having two sets of opposite sides (four sides) with respect to each of the third main surface 121 and the fourth main surface 122 in plan view.

The second substrate 12 is made of, for example, a carbon material, and formed as a structure in which graphene sheets in which six-membered rings are connected by a covalent bond are laminated. Each surface is coupled by van der Waals force in the material.

The second substrate 12 includes the recessed portion 12a opened on the fourth main surface 122. In the electronic element mounting substrate 1 of the first embodiment, the recessed portion 12a is opened from the fourth main surface 122 of the second substrate 12 to a middle of the second substrate 12 in a thickness direction. The recessed portion 12a overlaps the mounting portion 11a on the first main surface 111 of the first substrate 11 in perspective plan view, and can have good heat dissipation performance. The recessed portion 12a of the second substrate 12 can be formed, for example, on the fourth main surface 122 of the second substrate 12 by laser processing, screw hole processing, or the like. The recessed portion 12a is a region for positioning a heat transfer member 4 with good heat dissipation performance.

An aluminum nitride sintered body having a good thermal conductivity is preferably used as the first substrate 11. The first substrate 11 and the second substrate 12 are bonded together by a bonding material made of an active brazing material such as TiCuAg alloy and TiSnAgCu alloy, and the second main surface 112 of the first substrate 11 and the third main surface 121 of the second substrate 12 face each other. The bonding material is disposed between the first substrate 11 and the second substrate 12 with a thickness of approximately several tens of μm.

A substrate thickness T1 of the first substrate 11 is, for example, approximately 50 μm to 500 μm, and a substrate thickness T2 of the second substrate 12 is, for example, approximately 100 μm to 2000 μm. If the substrate thickness T1 of the first substrate 11 and the substrate thickness T2 of the second substrate 12 satisfy T2>T1, the heat of the first substrate 11 can be favorably radiated to the second substrate 12.

Figure 2:
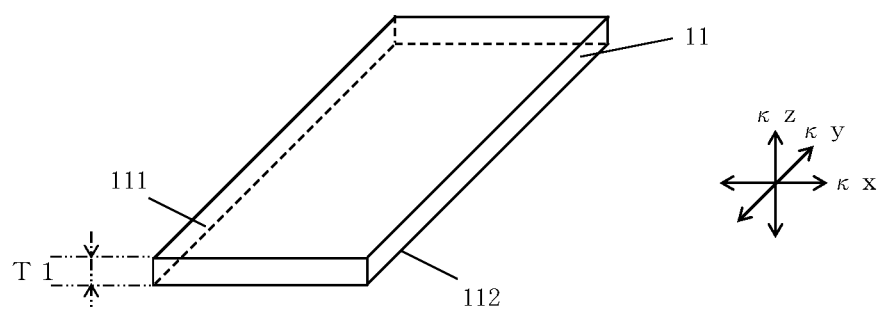
FIG. 2 is an exploded perspective view of a first substrate and a second substrate of the electronic element mounting substrate illustrated in FIG. 1.
Figure 2:
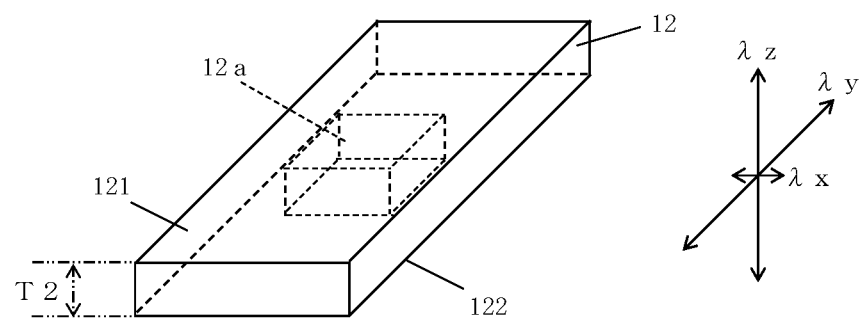
Figure 2:
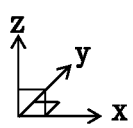
Figure 3A:
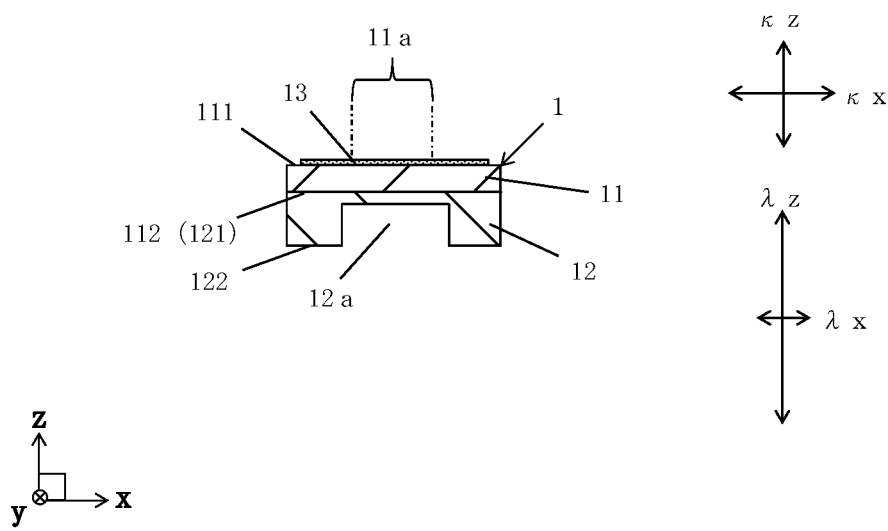
FIG. 3A is a longitudinal sectional view taken along the line A-A of the electronic element mounting substrate illustrated in FIG. 1A.
Figure 3B:
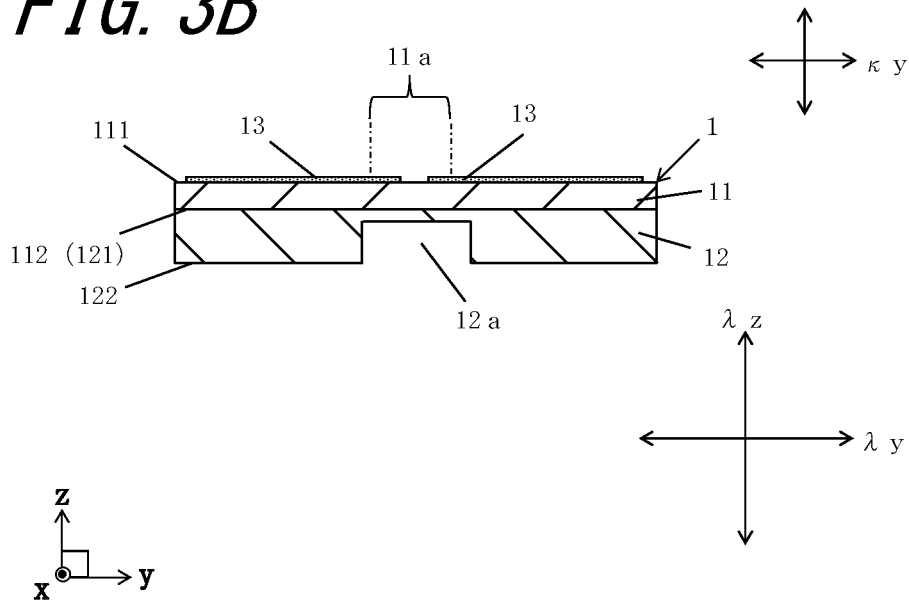
FIG. 3B is a longitudinal sectional view taken along the line B-B.

As in the example illustrated in FIG. 2, the thermal conductivity κ of the first substrate 11 is substantially constant in the X direction and the Y direction in a plane direction, and is also substantially constant in the plane direction and the thickness direction of the first substrate 11 ($\kappa x \approx \kappa y \approx \kappa z$). For example, if an aluminum nitride sintered body is used as the first substrate 11, the first substrate 11 having a thermal conductivity κ of approximately 100 to 200 W/m·K is used.

The thermal conductivity λ of the second substrate 12 differs in magnitude between the X direction and the Y direction in the plane direction. For example, the relationship between the thermal conductivities λx, λy, and λz in the respective directions of the second substrate 12 is "thermal conductivity λx thermal conductivity λz>>thermal conductivity λy" as illustrated in FIG. 2. For example, the thermal conductivity λy and the thermal conductivity λz of the second substrate 12 are approximately 1,000 W/m·K, and the thermal conductivity λx of the second substrate 12 is approximately 4 W/m·K. In the drawings of the embodiment of the present disclosure and the drawings of the embodiments described later, for the sake of convenience, the drawing in which any of thermal conductivity κx, κy, κz, λx, λy, and λz is omitted is included.

For example, the thermal conductivity of the electronic element mounting substrate 1 according to the embodiment of the present disclosure can be measured by an analysis method such as a laser flash method. If measuring the thermal conductivity of the second substrate 12, the bonding material bonding the first substrate 11 and the second substrate 12 together is removed, and measurement can be performed on the second substrate 12 by an analysis method such as a laser flash method.

The second substrate 12 is disposed so that the thermal conductivity λy in the longitudinal direction of the first substrate 11 and the thermal conductivity λz in the thickness direction of the second substrate 12 are greater than the thermal conductivity λx in a direction perpendicular to the longitudinal direction of the first substrate 11.

Metal layers 13 are located on the first main surface 111 of the first substrate 11 and the second substrate 12 is interposed between the metal layers 13 in the longitudinal direction of the first substrate 11 in plan view (perspective plan view). The metal layers 13 and the second substrate 12 are alternately located in the longitudinal direction of the first substrate 11 in plan view (perspective plan view). The metal layer 13 is used as, for example, a connection portion with a connection member 3 such as a bonding wire with an electrode of the electronic element 2.

The metal layer 13 includes a thin film layer and a plating layer. The thin film layer has, for example, an adhesion metal layer and a barrier layer. The adhesion metal layer constituting the thin film layer is located on the first main surface 111 of the first substrate 11. The adhesion metal layer is made of, for example, tantalum nitride, nickel-chromium, nickel-chromium-silicon, tungsten-silicon, molybdenum-silicon, tungsten, molybdenum, titanium, chromium, or the like, and is deposited on the first main surface 111 of the first substrate by adopting a thin film forming technique such as vapor deposition method, ion plating method, sputtering method, or the like. For example, if forming by using a vacuum deposition method, the first substrate 11 is installed in a film forming chamber of a vacuum deposition apparatus, and a metal piece to be an adhesion metal layer is disposed in a vapor deposition source in the film forming chamber. Thereafter, the film forming chamber is in a vacuum state (pressure of $10^{-2}$ Pa or less), and the metal piece disposed in the vapor deposition source is 7388472.1 heated and vapor-deposited, and molecules of the vapor-deposited metal piece are deposited on the first substrate 11. Therefore, a thin film metal layer to be an adhesion metal layer is formed. After a resist pattern is formed on the first substrate 11 on which the thin film metal layer is formed by using a photolithography method, an excess thin film metal layer is removed by etching, and thus an adhesion metal layer is formed. A barrier layer is deposited on the upper surface of the adhesion metal layer. The barrier layer has good adhesion and wettability with the adhesion metal layer and the plating layer, and functions to bond firmly the adhesion metal layer and the plating layer together and prevent mutual diffusion between the adhesion metal layer and the plating layer. The barrier layer is made of, for example, nickel-chromium, platinum, palladium, nickel, cobalt, and the like, and is deposited on the surface of the adhesion metal layer by a thin film forming technique such as a vapor deposition method, an ion plating method, or a sputtering method.

The thickness of the adhesion metal layer is preferably approximately 0.01 to 0.5 μm. If the thickness is less than 0.01 μm, it tends to be difficult to firmly adhere the adhesion metal layer on the first substrate 11. If the thickness exceeds 0.5 μm, separating of the adhesion metal layer is likely to occur due to internal stress during film formation of the adhesion metal layer. The thickness of the barrier layer is preferably approximately 0.05 to 1 μm. If the thickness is less than 0.05 μm, defects such as pinholes occur, and it tends to be difficult to perform the function as a barrier layer. If the thickness exceeds 1 μm, the barrier layer is likely to be separated due to internal stress during film formation.

The plating layer is deposited on the surface of the thin film layer by electrolytic plating method or electroless plating method. The plating layer is made of a metal, such as nickel, copper, gold, or silver, having a good corrosion resistance and a good connectivity with a connection member. For example, a nickel plating layer having a thickness of approximately 0.5 to 5 μm and a gold plating layer having a thickness of approximately 0.1 to 3 μm are sequentially deposited. As a result, corrosion of the metal layer 13 can be effectively suppressed, and the bonding between the electronic element 2 and the metal layer 13 or the bonding between the metal layer 13 and the connection member 3 can be strengthened.

A metal layer such as copper (Cu) or gold (Au) may be disposed on the barrier layer so that the plating layer is favorably formed. Such a metal layer is formed by a similar method to that of the thin film layer.

If the metal layer 13 is formed on the first main surface 111 of the first substrate 11 and the metal plating layer is formed on the metal layer 13, if a protective film made of resin, ceramics, metal, or the like is previously placed on the side surface and the fourth main surface 122 where the second substrate 12 is exposed, since the second substrate 12 made of a carbon material is not exposed if the electronic element mounting substrate 1 is manufactured, degradation of the quality caused by chemicals or the like can be reduced.

By mounting the electronic element 2 on the mounting portion 11a on the first main surface 111 of the electronic element mounting substrate 1, and positioning the heat transfer member 4 in the recessed portion 12a of the electronic element mounting substrate 1, the electronic device can be manufactured. The electronic element 2 mounted on the electronic element mounting substrate 1 is, for example, a light emitting element such as a laser diode (LD) or a light emitting diode (LED), or a light receiving element such as a photo diode (PD). For example, the electronic element 2 is mounted on the mounting portion 11a, and is mounted on the electronic element mounting substrate 1 by electrically connecting the electrode of the electronic element 2 and the metal layer 13 through the connection member 3 such as solder bump, gold bump, or conductive resin (anisotropic conductive resin). Alternatively, after the electronic element 2 is fixed on the mounting portion 11a by a bonding material such as Au—Sn, the electrode of the electronic element 2 and the metal layer 13 are electrically connected through the connection member 3 such as a bonding wire, and the electronic element 2 is mounted on the electronic element mounting substrate 1.

The heat transfer member 4 or a heat sink 5 is made of a material having a good thermal conductivity such as copper (Cu), copper-tungsten (CuW), copper-molybdenum (CuMo), or the like. The thermal conductivity κ2 of the heat transfer member 4 or the heat sink 5 is substantially constant in the X direction and the Y direction in the plane direction, and is also substantially constant in the plane direction and the thickness direction of the heat transfer member 4 or the heat sink 5 (κ2x≈κ2y≈κ2z). The thermal conductivity κ2 of the heat transfer member 4 or the heat sink 5 is greater than the thermal conductivity κ of the first substrate 11 (κ2x>κx, κ2y>κy, κ2z>κz).

According to the electronic element mounting substrate 1 in the embodiment of the present disclosure, the first substrate includes the first main surface 111, has the rectangular shape, and includes the mounting portion 11a for the electronic element 2 on the first main surface 111. The second substrate 12 is located on the second main surface 112 opposite to the first main surface 111, is made of the carbon material, has the rectangular shape, and includes the third main surface 121 facing the second main surface 112 and the fourth main surface 122 opposite to the third main surface 121. In the second substrate 12, the third main surface 121 or the fourth main surface 122 has heat conduction in the longitudinal direction greater than heat conduction in the direction perpendicular to the longitudinal direction in perspective plan view. The second substrate 12 includes the recessed portion 12a on the fourth main surface. Therefore, for example, if the electronic device is operated, heat generated from the electronic element 2 is easily transferred to the heat transfer member 4 in the recessed portion 12a, via the first substrate 11 and a space having a reduced thickness between the third main surface 121 of the second substrate 12 and a bottom surface of the recessed portion 12a, and heat is easily transferred in the longitudinal direction of the second substrate 12. Therefore, heat can be easily radiated from the mounting portion 11a for the electronic element 2 to the surroundings, and the electronic device can be favorably operated by suppressing malfunction of the electronic element 2 due to heat generated from the electronic element 2.

In particular, if an optical element such as an LD or LED is mounted as the electronic element 2, since heat can be reliably transferred to the heat sink 5 via the heat transfer member 4, by suppressing the distortion of the electronic element mounting substrate 1, the electronic element mounting substrate 1 for an optical device capable of emitting light with high accuracy can be obtained.

The electronic element mounting substrate 1 in the embodiment of the present disclosure can be suitably used in a thin and high-output electronic device, and the reliability of the electronic element mounting substrate 1 can be improved. For example, if an optical element such as an LD or LED is mounted as the electronic element 2, the electronic element mounting substrate 1 in the embodiment of the present disclosure can be suitably used as the electronic element mounting substrate 1 for an optical device that is thin and good in directivity.

As in the examples illustrated in FIGS. 1A to 4B, in perspective plan view, if the second substrate 12 is larger than the mounting portion 11a (larger than the electronic element 2), the heat of the electronic element 2 transferred to the second substrate 12 can be favorably transferred to the second substrate 12 in the longitudinal direction of the first substrate 11 and can be reliably transferred to the outside through the heat transfer member 4.

According to the electronic device according to the present disclosure, the electronic element mounting substrate 1 having the above configuration, and the electronic element 2 mounted on the mounting portion 11a of the electronic element mounting substrate 1, are included. Therefore, an electronic device having good long-term reliability can be obtained.

(Second embodiment) Next, an electronic element mounting substrate according to a second embodiment will be described with reference to FIGS. 5A to 7B.

An electronic device according to the second embodiment is different from the electronic device according to the above-described embodiment in that an inner wall surface of the recessed portion 12a has a screw shape. In the second embodiment, the metal layer 13 is illustrated by hatching in the examples illustrated in FIGS. 5A to 7B. The recessed portion 12a opens to the fourth main surface 122 of the second substrate 12, and the inner wall surface of the recessed portion 12a has the screw shape. In the drawings of the embodiment of the present disclosure and the drawings of the embodiment described later, for the sake of convenience, the drawing in which any of thermal conductivity κx, κy, κz, λx, λy, and λz is omitted is included.

According to the electronic element mounting substrate 1 in the second embodiment, similarly to the electronic element mounting substrate 1 according to the above-described embodiment, for example, if the electronic device is operated, heat generated from the electronic element 2 is easily transferred to the heat transfer member 4 in the recessed portion 12a, via the first substrate 11 and a space having a reduced thickness between the third main surface 121 of the second substrate 12 and a bottom surface of the recessed portion 12a, and heat is easily transferred in the longitudinal direction of the second substrate 12. Therefore, heat can be easily radiated from the mounting portion 11a for the electronic element 2 to the surroundings, and the electronic device can be favorably operated by suppressing malfunction of the electronic element 2 due to heat generated from the electronic element 2.

By positioning the heat transfer member 4 in the recessed portion 12a whose inner wall surface is the screw shape, the inner wall surface of the recessed portion 12a of the second substrate 12 and the heat transfer member 4 are preferably brought into contact with each other through the heat transfer member 4. Therefore, it is possible to provide an electronic element mounting substrate that can reliably transfer heat to an external heat sink 5 through the heat transfer member 4.

The first substrate 11 and the second substrate 12 are bonded together by a bonding material made of an active brazing material such as a TiCuAg alloy or a TiSnAgCu alloy, and the second main surface 112 of the first substrate 11 and the third main surface 121 of the second substrate 12 face each other. The bonding material is disposed between the first substrate 11 and the second substrate 12 with a thickness of approximately several tens of μm.

The recessed portion 12a of the second substrate 12 can be formed in the second substrate 12 by, for example, screw hole processing or the like.

In the electronic element mounting substrate 1 of the second embodiment, the substrate thickness T1 of the first substrate 11 is, for example, approximately 50 μm to 500 μm, and the substrate thickness T2 of the second substrate 12 is, for example, approximately 100 μm to 2000 μm. If the substrate thickness T1 of the first substrate 11 and the substrate thickness T2 of the second substrate 12 satisfy T2>T1, the heat of the first substrate 11 can be favorably radiated to the second substrate 12.

In the example illustrated in FIGS. 5A to 7B, the first substrate 11 has a plurality of mounting portions 11a for mounting the plurality of electronic elements 2 on the first main surface 111. The first substrate 11 and the second substrate 12 have a long rectangular shape in a direction where the plurality of electronic elements 2 is disposed (mounting portions 11a are disposed) in perspective plan view. The recessed portion 12a on the second substrate 12 partially overlaps the plurality of mounting portions 11a in perspective plan view.

As in the examples illustrated in FIGS. 5A to 7B, if the plurality of electronic elements 2 is mounted on the first main surface 111 of the first substrate 11, the heat transferred to the second substrate 12 is easily transferred in the longitudinal direction of the second substrate 12 than in the direction perpendicular to the longitudinal direction of the second substrate 12, and is transferred to the recessed portion 12a. Heat can be easily transferred to the outside favorably via the heat transfer member 4 in the recessed portion 12a.

The electronic element mounting substrate 1 according to the second embodiment can be manufactured using a similar manufacturing method to that of the electronic element mounting substrate 1 according to the above-described embodiment.

(Third embodiment) Next, an electronic device according to a third embodiment will be described with reference to FIGS. 8A to 10B.

An electronic element mounting substrate 1 according to the third embodiment is different from the electronic element mounting substrate 1 according to the above-described embodiments in that a third substrate 14 having a fifth main surface 141 facing the fourth main surface 122 and a sixth main surface 142 opposite to the fifth main surface 141 is located on the fourth main surface 122 of the second substrate 12. In the third embodiment, the metal layer 13 is illustrated by hatching in the examples illustrated in FIGS. 8A to 9B. In the example illustrated in FIGS. 8A to 9B, the first substrate 11 is indicated by a broken line in a region overlapping the recessed portion 12a in perspective plan view. In the drawings of the embodiment of the present disclosure and the drawings of the embodiment described later, for the sake of convenience, the drawing in which any of thermal conductivity κx, κy, κz, λx, λy, and λz is omitted is included.

The third substrate 14 has a rectangular plate-like shape having two sets of opposite sides (four sides) with respect to each of the fifth main surface 141 and the sixth main surface 142 in plan view. The third substrate 14 includes a through-hole 14a that penetrates in the thickness direction and is facing the recessed portion 12a of the second substrate 12.

According to the electronic element mounting substrate 1 in the third embodiment, similarly to the electronic element mounting substrate 1 according to the above-described embodiments, for example, if the electronic device is operated, heat generated from the electronic element 2 is easily transferred to the heat transfer member 4 in the recessed portion 12a, via the first substrate 11 and a space having a reduced thickness between the third main surface 121 of the second substrate 12 and a bottom surface of the recessed portion 12a, and heat is easily transferred in the longitudinal direction of the second substrate 12. Therefore, heat can be easily radiated from the mounting portion 11a for the electronic element 2 to the surroundings, and the electronic device can be favorably operated by suppressing malfunction of the electronic element 2 due to heat generated from the electronic element 2.

In the examples illustrated in FIGS. 8A to 10B, the first substrate 11 includes a plurality of mounting portions 11a for mounting the plurality of electronic elements 2 on the first main surface 111. The first substrate 11, the second substrate 12, and the third substrate 14 have the long rectangular shapes in the direction where the plurality of electronic elements 2 is disposed (mounting portions 11a are disposed) in perspective plan view. The recessed portion 12a in the second substrate 12 and the through-hole 14a in the third substrate 14 partially overlap the plurality of mounting portions 11a in perspective plan view, and can have good heat dissipation performance.

Similarly to the first substrate 11, an aluminum nitride sintered body having a good thermal conductivity is preferably used as the third substrate 14. Similarly to the first substrate 11, the thermal conductivity κ of the third substrate 14 is substantially constant in the X direction and the Y direction in the plane direction, and is also substantially constant in the plane direction and the thickness direction of the first substrate 11. In the first substrate 11 and the second substrate 12, the second main surface 112 of the first substrate 11 and the third main surface 121 of the second substrate 12 are bonded together by a bonding material made of an active brazing material such as TiCuAg alloy or TiSnAgCu alloy. The fourth main surface 122 of the second substrate and the fifth main surface 141 of the third substrate 14 are bonded together by a bonding material made of an active brazing material such as a TiCuAg alloy or a TiSnAgCu alloy. The bonding material is disposed between the first substrate 11 and the second substrate 12 and between the second substrate 12 and the third substrate 14 with a thickness of approximately several tens of μm.

In the electronic element mounting substrate 1 of the third embodiment, the substrate thickness T1 of the first substrate 11 is, for example, approximately 50 μm to 500 μm, the substrate thickness T2 of the second substrate 12 is, for example, approximately 100 μm to 2000 μm, and a substrate thickness T3 of the third substrate 14 is, for example, approximately 50 μm to 500 μm. If the substrate thickness T1 of the first substrate 11 and the substrate thickness T2 of the second substrate 12 satisfy T2>T1, the heat of the first substrate 11 can be favorably radiated to the second substrate 12.

If the first substrate 11 and the third substrate 14 are formed of the similar material, for example, the first substrate 11 is made of an aluminum nitride sintered body having a thermal conductivity κ of 200 W/m·K, the third substrate 14 is a substrate ($κx≈κ3x$, $κy≈κ3y$, $κz≈κ3z$) made of an aluminum nitride sintered body having a thermal conductivity κ3 of 200 W/m·K, and the substrate thickness T1 of the first substrate 11 and the substrate thickness T3 of the third substrate 14 are set to the similar thickness ($0.9T1≤T3≤1.1T1$), since the first substrate 11 and the third substrate 14 are located across the second substrate 12 where the heat conduction in the longitudinal direction is larger than the heat conduction in the direction perpendicular to the longitudinal direction, the distortion of the electronic element mounting substrate 1 is reduced if the electronic device is operated, and the electronic element mounting substrate 1 capable of favorably radiating heat to the outside via the heat transfer member 4 in the recessed portion 12a can be obtained.

The inner wall surface of the through-hole 14a of the third substrate 14 may have a screw shape as in the examples illustrated in FIGS. 8A to 10B. In this case, the inner wall surface of the through-hole 14a of the third substrate 14 and the heat transfer member 4 can be preferably brought into contact with each other, and it is possible to provide an electronic element mounting substrate that can reliably transfer heat to the external heat sink 5.

Since the fifth main surface 141 of the third substrate is located on the fourth main surface 122 of the second substrate 12, in the electronic element mounting substrate 1, the fourth main surface 122 of the second substrate 12 is not exposed, and degradation of the quality caused by chemicals or the like can be reduced if the metal layer 13 is formed on the first main surface 111 of the first substrate 11 and the metal plating layer is formed on the metal layer 13. Similarly, if the metal layer 13 is formed on the first main surface 111 of the first substrate 11 and the metal plating layer is formed on the metal layer 13, a protective film made of resin, ceramics, metal, or the like may be previously located on the exposed side surface of the second substrate 12.

The electronic element mounting substrate 1 according to the third embodiment can be manufactured using a similar manufacturing method to that of the electronic element mounting substrate 1 according to the above-described embodiments.

The present disclosure is not limited to the example embodiments described above, and various modifications are possible. For example, the metal layer 13 on the first main surface 111 of the first substrate 11 is formed by a thin film method in the above-described example, and may be a metal layer using a known co-firing or post-firing in the related art. If such a metal layer 13 is used, the metal layer 13 is previously disposed on the first main surface 111 of the first substrate 11 before the first substrate 11 and the second substrate 12 are bonded together. The above-described method may be used in order to improve the flatness of the first substrate 11.

The electronic element mounting substrate 1 according to the first embodiment to the electronic element mounting substrate 1 according to the third embodiment are formed by single insulating layer. The number of insulating layers may be different from single insulating layer. For example, the electronic element mounting substrate 1 according to the first to third embodiments may be formed of two or more insulating layers.

The invention claimed is:

1. An electronic element mounting substrate comprising:
a first substrate that is made of a carbon material and comprises a first surface and a second surface opposite to the first surface; and
a plurality of mounting portions located on a side of the first surface of the first substrate so that electronic elements can be mounted thereon, the plurality of mounting portions being aligned in a first direction which is one of directions along the first surface, wherein
a thermal conductivity $\lambda y$ in the first direction of the first substrate is greater than a thermal conductivity $\lambda x$ in a second direction of the first substrate which is one direction of the directions along the first surface and perpendicular to the first direction,
the first substrate comprises a recessed portion which opens to the second surface, and
the recessed portion comprises a bottom surface intersecting with an axis extending in a third direction perpendicular to the first direction and the second direction.

2. The electronic element mounting substrate according to claim 1, wherein a thermal conductivity $\lambda z$ in the third direction of the first substrate is greater than the thermal conductivity $\lambda x$ in the second direction of the first substrate.

3. The electronic element mounting substrate according to claim 1, wherein a depth in the third direction of the recessed portion is equal to or more than a half of a thickness of the first substrate.

4. The electronic element mounting substrate according to claim 1, wherein an opening of the recessed portion has a round shape when seen in the third direction.

5. The electronic element mounting substrate according to claim 4, wherein an inner wall surface of the recessed portion has a helically grooved screw shape.

6. The electronic element mounting substrate according to claim 1, further comprising a heat transfer member located in the recessed portion, the heat transfer member extending along the third direction.

7. The electronic element mounting substrate according to claim 1, further comprising a second substrate that is located opposite to the plurality of mounting portions with respect to the first substrate,
the second substrate comprising a third surface facing the second surface of the first substrate, and a fourth surface opposite to the third surface,
the second substrate being provided with a through-hole that is positioned so as to overlap the recessed portion when seen in the third direction and penetrates from the third surface to the fourth surface.

8. The electronic element mounting substrate according to claim 6, further comprising a second substrate that is located opposite to the plurality of mounting portions with respect to the first substrate in the third direction,
the second substrate comprising a third surface facing the second surface of the first substrate, and a fourth surface opposite to the third surface,
the second substrate being provided with a through-hole that is positioned so as to overlap the recessed portion when seen in the third direction and penetrates from the third surface to the fourth surface,
the heat transfer member being inserted in the through-hole.

9. The electronic element mounting substrate according to claim 6, further comprising a third substrate that is located between the plurality of mounting portions and the first substrate, in the third direction,
the third substrate comprising a fifth surface and a sixth surface facing the first surface, the fifth surface being opposite to the sixth surface,
the bottom surface of the recessed portion being located between the third substrate and the heat transfer member, in the third direction.

10. The electronic element mounting substrate according to claim 1, further comprising a third substrate that is located between the plurality of mounting portions and the first substrate, in the third direction, and comprises a fifth surface and a sixth surface facing the first surface, the fifth surface being opposite to the sixth surface.

11. The electronic element mounting substrate according to claim 9, wherein a thermal conductivity $\kappa 2$ of the heat transfer member is equal to or more than a thermal conductivity $\kappa$ of the third substrate.

12. The electronic element mounting substrate according to claim 10, wherein a thermal conductivity $\kappa 2$ of the heat transfer member is equal to or more than a thermal conductivity $\kappa$ of the third substrate.

13. The electronic element mounting substrate according to claim 10, further comprising a metal layer configured so as to be located between the third substrate and the electronic elements to be mounted on the plurality of mounting portions.

14. The electronic element mounting substrate according to claim 2, wherein in the first substrate, an absolute value of a difference between the thermal conductivity $\lambda y$ in the first direction and the thermal conductivity $\lambda x$ in the second direction is greater than an absolute value of a difference between the thermal conductivity $\lambda y$ in the first direction and the thermal conductivity $\lambda z$ in the third direction, and an absolute value of a difference between the thermal conductivity $\lambda z$ in the third direction and the thermal conductivity $\lambda x$ in the second direction is greater than an absolute value of a difference between the thermal conductivity $\lambda z$ in the third direction and the thermal conductivity $\lambda y$ in the first direction.

15. The electronic element mounting substrate according to claim 1, wherein at least two mounting portions of the plurality of mounting portions are arranged so as to overlap the recessed portion when seen in the third direction.

16. The electronic element mounting substrate according to claim 9, wherein one end in the third direction of the heat transfer member is exposed from the second substrate, and
a dimension in the first direction of the one end is greater than an inner diameter in the first direction of the recessed portion.

17. An electronic device comprising:
a plurality of electronic elements; and
an electronic element mounting substrate on which the plurality of electronic elements are mounted, wherein
the electronic element mounting substrate comprises
a first substrate that is made of a carbon material and comprises a first surface and a second surface opposite to the first surface,
the plurality of electronic elements are aligned in a first direction which is one of directions along the first surface,
a thermal conductivity $\lambda y$ in the first direction of the first substrate is greater than a thermal conductivity $\lambda x$ in a second direction of the first substrate which is one direction of the directions along the first surface and perpendicular to the first direction,
the first substrate comprises a recessed portion which opens to the second surface, and
the recessed portion comprises a bottom surface intersecting with an axis extending in a third direction perpendicular to the first direction and the second direction.

* * * * *